(12) United States Patent
Kikuchi et al.

(10) Patent No.: US 8,435,641 B2
(45) Date of Patent: May 7, 2013

(54) PROCESS FOR PRODUCING HEAT-RESISTANT FLEXIBLE LAMINATE AND HEAT-RESISTANT FLEXIBLE LAMINATE PRODUCED THEREBY

(75) Inventors: Takashi Kikuchi, Otsu (JP); Naoki Hase, Otsu (JP); Hiroyuki Tsuji, Otsu (JP); Yasuo Fushiki, Kyoto (JP)

(73) Assignee: Kaneka Corporation, Osaka-shi, Osaka (JP)

(*) Notice: Subject to any disclaimer, the term of this patent is extended or adjusted under 35 U.S.C. 154(b) by 1026 days.

(21) Appl. No.: 10/532,766

(22) PCT Filed: Oct. 9, 2003

(86) PCT No.: PCT/JP03/13010
§ 371 (c)(1),
(2), (4) Date: Apr. 26, 2005

(87) PCT Pub. No.: WO2004/048082
PCT Pub. Date: Jun. 10, 2004

(65) Prior Publication Data
US 2006/0054262 A1     Mar. 16, 2006

(30) Foreign Application Priority Data

Nov. 28, 2002  (JP) ................................. 2002-346274
Sep. 9, 2003   (JP) ................................. 2003-316851

(51) Int. Cl.
*B32B 27/06* (2006.01)
*B32B 27/36* (2006.01)

(52) U.S. Cl.
USPC ..................................................... 428/473.5

(58) Field of Classification Search ................ 428/473.5
See application file for complete search history.

(56) References Cited

U.S. PATENT DOCUMENTS 5,891,291 A * 4/1999 Okamoto et al. ........... 156/273.9
6,203,918 B1 * 3/2001 Shimose et al. ............. 428/458

FOREIGN PATENT DOCUMENTS

| EP | 1014766 A1 | 6/2000 |
| EP | 1014766 A2 | 6/2000 |
| EP | 1152069 A1 | 7/2001 |
| EP | 1014766 A1 | 2/2003 |
| EP | 1014766 A3 | 2/2003 |
| EP | L1642 | 7/2010 |
| JP | 05-347461 | 12/1993 |
| JP | 08058020 A1 | 5/1996 |
| JP | 09-199830 | 7/1997 |
| JP | 10-235784 | 9/1998 |
| JP | 11-004055 | 1/1999 |
| JP | 2001-105532 | 4/2001 |
| JP | 2001-270033 | 10/2001 |
| JP | 2001-310344 | 11/2001 |

OTHER PUBLICATIONS

English Machine Translation of JP 2001-310344 (Hase et al.), Nov. 2001.*
English Machine Translation of JP 10-235784 (Sugitani et al.), Sep. 1998.*

* cited by examiner

*Primary Examiner* — Terressa Boykin
(74) *Attorney, Agent, or Firm* — Westerman, Hattori, Daniels & Adrian, LLP

(57) ABSTRACT

A method for manufacturing a heat resistant flexible laminate effectively enabling avoidance of not only visual defects but occurrence of dimensional changes, and a heat resistant flexible laminate are provided. In a process for laminating a heat resistant adhesive material and a metallic foil by thermal lamination, a film-like protective material is disposed between a pressurized surface and the metallic foil at the time of thermal lamination. At this time, coefficients of linear expansion in a temperature range of 200 degree C. to 300 degree C. of the heat resistant adhesive material and the protective material are within a range of a coefficient of linear expansion of the metallic foil ±10 ppm/degrees C. Thereby, occurrence of visual defects is not only effectively avoidable, but excellent dimensional change after etching may be exhibited.

3 Claims, No Drawings

PROCESS FOR PRODUCING HEAT-RESISTANT FLEXIBLE LAMINATE AND HEAT-RESISTANT FLEXIBLE LAMINATE PRODUCED THEREBY

This application is a nationalization of PCT application No. PCT/JP2003/013010 filed on Oct. 9, 2003 claiming priorities based on Japanese Application No. 2002-346274 filed on Nov. 28, 2002 and Japanese Application No. 2003-316851 filed on Sep. 9, 2003, the content of which are incorporated herein by reference in their entirety.

FIELD OF THE INVENTION

The present invention relates to a process for producing a heat resistant flexible laminate, and a heat resistant flexible laminate obtained by the same. More particularly, the invention relates to a heat resistant flexible laminate, wherein specifying of a coefficient of linear expansion of a protective material and an adhesive material used at the time of thermal lamination can avoid occurrence of visual defects, such as creases at the time of lamination, and can improve dimensional stability before and after etching process, and also to a heat resistant flexible laminate obtained by the method.

BACKGROUND ART

Recently, as electronic devices have been more and more downsized and reduced the weight, printed circuit boards, especially, a flexible laminate (referred to also as flexible printed circuit board (FPC) etc.) has been demanded. The flexible laminate has a structure having a circuit comprising a metallic foil formed on an electric insulating film.

In general, the flexible laminate is formed of various electric insulating materials, and has an electric flexible insulating film as a substrate, and is manufactured by a method of laminating by heating and sticking by pressure a metallic foil onto a surface of the substrate with various adhesive materials. As the electric insulating film, a polyimide film etc. is preferably used.

As methods for laminating the metallic foil, a pressing method and a method of continuously carrying out lamination under a heated condition (thermal lamination method) are used. A multistage press, a vacuum press, etc. are used in the pressing method, and a double-belt press machine or a heated roll-laminating machine etc. is used in thermal lamination method. From a viewpoint of productivity, a thermal lamination method can more preferably be used.

In the thermal lamination method described above, appropriate conditions are selected in conformance with adhesive material to be used. When thermosetting resins, such as epoxy resins, are used for adhesive materials, usually, heating temperature at the time of thermal lamination (thermal-press forming device temperature) is less than 200 degrees C. (refer to Japanese publication of patent application; Japanese Patent Laid-Open No. 9-199830 official report (published on July 31, Heisei 9 (1997)) and Japanese Patent Laid-Open No. 10-235784 official report (published on September 8, Heisei 10 (1998))). Moreover, use of materials of thermally fusible type as the adhesive material, such as thermoplastic polyimides, usually requires elevated temperature of not less than 200 degrees C. as the heating temperature in order to develop thermally fusible property.

Here, heating temperatures of less than 200 degrees C. may decrease thermal stress applied to materials to be laminated, that is, an insulating film, a metallic foil, and an adhesive material, and therefore does not permit the tendency of occurrence of visual defects such as wrinkling at the time of thermal lamination in the flexible laminate obtained. On the other hand, heating temperatures of not less than 200 degrees C. increases dimensional changes caused by thermal expansion and thermal contraction of materials to be laminated, and therefore occurs a problem of visual defects such as wrinkling easily formed in a laminate to be obtained (laminated layer including laminated structure of insulating film/adhesive material/metallic foil).

A technique is proposed wherein disposition of a protective material between a pressurized surface and a metallic foil improves the above-mentioned visual defects during thermal lamination in case of using thermoplastic polyimides as an adhesive material (refer to Japanese publication of patent application: Japanese Patent Laid-Open No. 2001-310344 official report (published November 6, Heisei 13 (2001))). In the technique, since thermal lamination of materials to be laminated is performed using the protective material disposed on the outside of metallic foil, the protective material suppresses motions in a planar direction caused in the thermoplastic polyimide after thermal lamination. And therefore limitation in the motion of the thermoplastic polyimide enables suppression of occurrence of visual defects such as wrinkling.

However, the technique of disposing the protective material still has a problem of inadequate effect in a point of effective control of dimensional change caused in the laminated layer obtained even if it enables effective control of occurrence of visual defects.

Specifically, thermal expansion and thermal contraction of the materials to be laminated cause not only the visual defects, but occurrence of residual stress in the laminated layer after cooling. This residual stress becomes actualized as a dimensional change in the case of formation of wiring and circuit that have been formed in predetermined patterns by etching of the metallic foil.

In order to realize downsizing and weight saving of electric devices, in recent years miniaturization of wiring formed in a substrate progresses, and therefore miniaturized and high-density packaging parts are packaged. Therefore, when a dimensional change becomes larger after forming of minute wiring to cause a certain amount of shift of disposed position of parts in a designing phase, the shift leads to a problem of disabling excellent bonding between the parts and a substrate.

Thus, thermal expansion and thermal contraction of materials to be laminated at the time of thermal lamination has a large effect also on dimensional change. On the other hand, although the technique of disposing the protective material enables limitation of motion of the thermoplastic polyimide to avoid visual defects, it was difficult for the technique to effectively avoid occurrence of residual stress after thermal lamination. As a result, unavoidable dimensional change will occur after etching in the flexible laminate obtained.

SUMMARY OF THE INVENTION

The present invention is performed in view of the problems described above, and the present invention aims at providing a method for manufacturing a heat resistant flexible laminate that can effectively avoid not only visual defects but occurrence of dimensional change, and at providing a heat resistant flexible laminate with high quality obtained by the method.

A wholehearted investigation performed by the present inventors revealed that setting of a coefficient of linear expansion of a protective material similar to a coefficient of linear expansion of materials to be laminated, especially, a metallic foil and adhesive materials (thermoplastic polyimide etc.)

effectively enables avoidance of visual defects and dimensional change, leading to completion of the present invention.

A method for manufacturing a heat resistant flexible laminate of the present invention is a method for manufacturing a heat resistant flexible laminate comprising a step of laminating a heat resistant adhesive material and a metallic foil by thermal lamination, wherein a film-like protective material is disposed between a pressurized surface and the metallic foil at the time of thermal lamination, and coefficients of linear expansion of the heat resistant adhesive material and the protective material in a temperature range of 200 degrees C. to 300 degrees C. are within a range of $\alpha_0 \pm 10$ ppm/degree C., when a coefficient of linear expansion of the metallic foil is defined as $\alpha_0$.

In the method, the thermal lamination is preferably carried out using a thermal lamination device enabling continuous heating and continuous pressurization. Moreover, an adhesive layer of the heat resistant adhesive material preferably has a thermoplastic polyimide resin as a principal component, and the protective material preferably consists of a non-thermoplastic polyimide film, and a thickness is preferably not less than 75 micrometers, and furthermore the metallic foil is preferably of a copper foil.

A heat resistant flexible laminate by the present invention is preferably obtained by the manufacturing method and a percentage of dimensional change between before and after removal of at least a portion of the metallic foil by etching is preferably in a range of ±0.05%.

A method for manufacturing a heat resistant flexible laminate by the present invention and a heat resistant flexible laminate obtained by the method may adapt coefficients of linear expansion of the protective material, the heat resistant adhesive material, and the metallic foil constituting the flexible laminate within an almost similar range, thereby enabling avoidance of occurrence of residual stress in the protective material and the heat resistant adhesive material. Therefore, occurrence of visual defects in the heat resistant flexible laminate is not only avoided effectively, but a percentage of dimensional change after etching can be suppressed within a range small enough. As a result, the heat resistant flexible laminate obtained has an excellent dimensional stability, thus exhibiting advantage of being especially preferably used as a wiring plate for miniaturized and high-density electronic devices.

Further objects, features, and advantages of the present invention will be fully understood with reference to description shown hereinafter. Moreover, advantages of the present invention will become clear with reference to following description referring to accompanying drawings.

BEST MODE FOR CARRYING-OUT OF THE INVENTION

Hereinafter, descriptions about an embodiment of the present invention will be given. Besides, the present invention is not limited to the descriptions.

In a method for manufacturing a flexible laminate by the present invention, a protective material is disposed between a pressurized surface and the metallic foil, and simultaneously coefficients of linear expansion of the heat resistant adhesive material and the protective material within a range of 200 degrees C. to 300 degrees C. are set so as to be in a range of −10 to +10 ppm/degree C. of a coefficient of linear expansion of the metallic foil, in a process of lamination of the heat resistant adhesive material and the metallic foil. Thereby, occurrence of residual stress caused by a heating-cooling cycle at the time of thermal lamination can be suppressed, and as a result a flexible laminate having excellent appearance after thermal lamination and moreover a smaller percentage of dimensional change may be obtained.

<Heat Resistant Flexible Laminate>

A heat resistant flexible laminate by the present invention is not especially limited, as long as it is obtained by a method by the present invention described in full detail later, and is a laminate having a structure with a metallic foil laminated through an adhesive material on a substrate, and the substrate and the adhesive material are heat resistant. In other words, a heat resistant flexible laminate by the present invention should just be a laminated layer comprising laminated structure of (heat resistant substrate/heat resistant adhesive material/metallic foil) in a structure thereof, and it may comprise other layers. Besides, "heat resistance" in a heat resistant flexible laminated layer as used herein means characteristic exhibiting durability in use at not less than 200 degrees C.

A substrate having heat resistance should just be a substrate exhibiting durability to heating temperatures in a thermal lamination process, and be flexible, and since a heat resistant flexible laminate by the present invention can suitably be used for applications of electronic and electrical devices (components also included), it is extremely preferable that the heat resistant flexible laminate have insulating properties and a film shape. In general, various resin films can suitably be used as a film having electric insulating properties (referred to as insulating film) without special limitation, and a polyimide film exhibiting excellent heat resistance and having other excellent physical properties may preferably be used.

Although the metallic foil is not especially limited, in use of the heat resistant flexible laminate for application of electronic devices and electrical devices, foils comprising copper and alloys of copper, stainless steels and alloys thereof, nickel and alloys of nickel (42 alloys included), aluminum or alloys of aluminum etc. may be mentioned. In general, flexible laminates, copper foil such as rolled copper foils or electrolytic copper foils are often used. Besides, a surface of these metallic foils may have a rust proofing layer, a heat-resistant layer, or an adhesive layer applied thereon. Moreover, a thickness of the metallic foil is not especially limited and a thickness enabling sufficient performance is used according to the application.

<Heat Resistant Adhesive Material>

An adhesive material having heat resistance (referred to as heat resistant adhesive material) is not especially limited, as long as the material has durability to heating temperatures in a thermal lamination process, adhesive property enabling lamination of a metallic foil to the insulating film, and furthermore a coefficient of linear expansion specified as mentioned later. Specifically, for example, adhesive sheet (referred to as thermally fusible sheet) having thermally fusible properties, such as thermoplastic resin films, papers having thermoplastic resins impregnated therein, and glass cloths having thermoplastic resins impregnated therein etc. may be mentioned. Especially, thermally fusible adhesive sheets or thermoplastic resin films may preferably be used for a flexible laminate.

Although the thermoplastic resins used for the heat resistant adhesive material are not especially limited as long as they have heat resistance, for example, thermoplastic polyimides, thermoplastic polyamideimides, thermoplastic polyether imides, thermoplastic polyester imides, etc. may be mentioned. Especially, thermoplastic polyester imides or thermoplastic polyimides are suitably used.

In the heat resistant adhesive materials, as mentioned above, thermally fusible sheets are not especially limited as long as they are formed in a shape of a sheet and they develop adhesive property with heat, and the thermally fusible sheet preferably includes thermoplastic resins having heat resistance not less than 50% in the present invention.

As examples of the thermally fusible sheet, as mentioned above, thermoplastic resin films may be mentioned. A thermoplastic resin film can fuse with heat applied, enter into uneven structure of a surface to be bonded, and then lose flowability with cooling to develop adhesive strength. The thermoplastic resin film used in the present invention is not especially limited as long as it is obtained by molding the thermoplastic resin having heat resistance into a shape of a film. Moreover, thickness of the film and molding conditions etc. are not especially limited, and any methods may be used when sufficient adhesive property is exhibited.

As other examples of the thermally fusible sheet, a film including not less than 50% of the thermoplastic resin having heat resistance, and further including a thermosetting resin (referred to as thermoplastic-thermosetting resin film, for convenience) may also be mentioned. That is, in the present invention, a thermoplastic-thermosetting resin film obtained by blending of a thermosetting resin, such as epoxy resins, etc. may be used as a thermally fusible sheet. Application of heat may fuse also the thermosetting resins, such as epoxy resins, force the resins enter into uneven structures of a surface to be bonded, and then curing by cross-linking accomplishes adhesion.

A thermoplastic-thermosetting resin film used in the present invention is not especially limited, as long as it is a film obtained by molding the resin composition including each of the resins into a shape of a film. Moreover, neither a thickness of the film, nor molding conditions, etc. is especially limited at this time. And moreover any methods may be used as long as sufficient adhesive property can be developed.

Besides, various additives may be blended with the thermally fusible sheet in order to improve various characteristics. An amount of blending of the additives is not especially limited, and as long as it is within a range to develop sufficient adhesive property, any amount may be used. Moreover, even in the case where various additives are added, neither a thickness of the thermally fusible sheet, nor molding conditions, etc. are especially limited, any methods may be used as long as sufficient adhesive property can be developed.

A structure of the heat resistant resin material is not limited in particular, and the heat resistant resin material may have a structure comprising a single-layered adhesive layer (for example, comprising only one thermally fusible sheet), as long as it has a certain level of rigidity, and sufficient insulating properties and sufficient adhesive property. Moreover, when use of only an adhesive layer provides inadequate rigidity, a laminated layer with three-layered structure (adhesive layer/core film/adhesive layer) obtained by disposing a material of a shape of a sheet or a shape of a film having rigidity in a central part (referred to as core film), may be used as a heat resistant resin material.

As the core film used at this time, for example, non-thermoplastic polyimide films may preferably be used. Besides, "non-thermoplasticity" as used herein designates a a characteristic in which the film cannot easily be softened, or cannot fuse with heat, but can sufficiently maintain an original shape thereof in thermal lamination processes, and it is not limited to characteristics, such as, what is called, thermosetting characteristics.

Accordingly, in a heat resistant flexible laminate in the present invention, a heat resistant resin material may be obtained by using the above-described insulating films (polyimide film etc.) as a core material to form adhesive layers on both sides. That is, in the present invention, a laminated layer having a heat resistant resin material serving as the insulating film layer may be used. Moreover, the laminated layer is not limited to a three-layered structure, and may have a structure of not less than 4 layers including other layers based on applications of the heat resistant flexible laminate.

As described above, a heat resistant adhesive material in the present invention should just have a structure of an adhesive layer constituted so as to have a thermoplastic resin, preferably a thermoplastic polyimide resin as a principal component, and it may have a single layered structure or may have multi layered structure with not less than 3 layers. Furthermore, it may be a laminated layer obtained by laminating two kinds of adhesive layers according to applications thereof. Moreover, the adhesive layer should just include at least the above-described thermoplastic resin, and naturally it may include other components as described above. As long as adhesive property of the adhesive layer is not adversely affected, examples of other components, amount of blending, blending conditions, etc. are not limited in particular.

Description will, hereinafter, be given using a laminated layer having an insulating film serving as a heat resistant resin material as an example in the following description. Therefore, "a heat resistant adhesive material" may be replaced to "an insulating film" corresponding to a context in descriptions of embodiments or below-mentioned Examples.

Methods for manufacturing (method for producing) the heat resistant adhesive material is not especially limited, in case of a heat resistant adhesive material consisting of one layer of adhesive layer (for example, in case of only a thermally fusible sheet), the heat resistant adhesive material may be obtained by forming a film of the thermoplastic resin or a resin composition including the thermoplastic resin using a belt cast method, extrusion method, etc. Moreover, when a heat resistant adhesive material is a laminated layer having a three-layered structure, a method of separately forming an adhesive layer on each side of a core film or a method of simultaneously forming two adhesive layers on both sides of a core film may be mentioned.

Methods of forming the adhesive layer is not especially limited, and there may be mentioned a method in which a thermoplastic resin or a resin composition including the thermoplastic resin is dissolved or dispersed into an organic solvent to prepare a resin solution, and this resin solution is then applied on a surface of a core film, and dried, and a method in which a thermoplastic resin or a resin composition including the thermoplastic resin is formed into a film or a sheet, and then the film or a sheet is applied onto a surface of a core film. Furthermore, a method in which each resin of (adhesive layer/ core film/adhesive layer) is co-extruded to form a film layer using a substantially single step process may also be adopted.

Moreover, in case of using the thermoplastic polyimide as the thermoplastic resin, the resin solution may be prepared using the thermoplastic polyimide and subsequently the solution may be applied onto a surface of the core film, or a solution of polyamido acid (polyamic acid) of a precursor of the thermoplastic polyimide is prepared, the solution is applied onto a surface of the core film, and subsequently the applied surface may be imidized. Neither synthetic methods of polyamido acids nor conditions of imidization of the polyamido acids at this time are especially limited, and conventionally well-known raw materials, conditions, etc. can be used (for example, refer to Example mentioned later). Moreover, the polyamido acid solution may include other materials according to applications.

<Method for Manufacturing a Heat Resistant Flexible Laminate>

A method for manufacturing a heat resistant flexible laminate by the present invention comprises at least a process for laminating a heat resistant adhesive material and a metallic foil by thermal lamination, this process disposes a film-like protective material between a pressurized surface and the metallic foil at the time of thermal lamination. Besides, a process for laminating the heat resistant adhesive material and the metallic foil by thermal lamination is hereinafter referred to as a thermal lamination process.

In the thermal lamination process, a thermal lamination device enabling continuous lamination of heated materials to be laminated while concurrently pressurizing (bonding by pressure), and specific configuration of the device is not especially limited. Specific configuration of means (thermal lamination means) to carry out the thermal lamination process is not especially limited.

Heating systems of materials to be laminated in the thermal lamination means are not especially limited, and heating means adopting conventionally well-known systems that enable heating at predetermined temperatures, such as heating medium circulating systems, hot air heating systems, and induction heating systems and the like may be used. Likewise, pressurization methods of materials to be laminated in the thermal lamination means are not especially limited, either, and pressurization means adopting conventionally well-known systems that enable application of predetermined pressures, such as oil-hydraulic systems, pneumatic systems, and gap-framepress and the like may be used.

A lamination temperature that is a heating temperature in the thermal lamination process is preferably a temperature of not less than a glass transition temperature (Tg) of the heat resistant adhesive material+50 degrees C., and more preferably it is a temperature of Tg of the heat resistant adhesive material+100 degree C. At a temperature not less than Tg+50 degree C., excellent thermal lamination between the heat resistant adhesive material and the metallic foil will be enabled. Moreover, temperatures not less than a Tg+100 degree C. can raise a lamination velocity, and can achieve more improved productivity.

A lamination velocity in the thermal lamination process is preferably not less than 0.5 m/minute, and more preferably not less than 1.0 m/minute. Velocities not less than 0.5 m/minute enables sufficient thermal lamination processing, and velocities not less than 1.0 m/minute can achieve more improved productivity.

Higher lamination pressures, that is, higher pressures in the thermal lamination process show advantages of providing lower lamination temperatures, and higher lamination velocities, but in general, excessively high lamination pressures show tendency of worsening dimensional changes of the laminate to be obtained. Moreover, excessively low lamination pressures reduce adhesive strength of the metallic foil of the laminate obtained conversely. Therefore, a lamination pressure is preferably within a range of 49 N/cm to 490 N/cm (5 kgf/cm to 50 kgf/cm), and more preferably it is within a range of 98 N/cm to 294 N/cm (10 kgf/cm to 30 kgf/cm). The ranges are excellent for all of the three conditions of lamination temperature, lamination velocity, and lamination pressure, and may achieve further improved productivity.

In a method for manufacturing a heat resistant flexible laminate by the present invention, as described above, a thermal lamination device for continuous bonding by pressure with concurrent heating of materials to be laminated is used. In the thermal lamination device, a delivery means of the material to be laminated for delivering out the material to be laminated may be provided in a preceding step of the thermal lamination means, and a taking up means for the material to be laminated for taking up the material to be laminated may be provided in a following step of the thermal lamination means. Productivity of the thermal lamination device can improve further by providing these means. Specific configuration of the delivery means of the material to be laminated and the taking up means for the material to be laminated is not especially limited, and well-known rolled form taking up devices enabling take up of the heat resistant adhesive material, the metallic foil, or the laminate obtained may be mentioned.

And, more preferably a taking up means for the protective material and a delivery means for the protective material for taking up or for delivering the protective material are provided. When these taking up means for the protective material, and delivery means for the protective material are provided, re-use of the protective material may be possible by disposing again, in a delivery side, the protective material that are already used once and taken up in the thermal lamination process. Moreover, when taking up the protective material, detection means of end positions for arranging both ends of the protective material and an adjusting means of taking up location may be provided. Since these means can arrange both ends of the protective material and take up with sufficient precision, efficiency of re-use can be increased. Besides, specific configuration of these taking up means for the protective material, delivery means for the protective material, the detection means of end positions, and the adjusting means of taking up location is not especially limited, and conventionally well-known various devices may be used.

A method for manufacturing a heat resistant flexible laminate by the present invention may include processes other than the thermal lamination process. For example, the present invention may also include a process for forming pattern wirings by etching of a metallic foil (referred to as etching process) after a thermal lamination process. Moreover, the present invention may also include a process for laminating layers other than the metallic foil, the heat resistant substrate, and the heat resistant adhesive material if needed.

<Protective Material>

In a method for manufacturing a heat resistant flexible laminate by the present invention, a protective material is disposed between a pressurized surface and a metallic foil in a thermal lamination means of a thermal lamination process.

The protective material is not especially limited, as long as it is a material having durability to heating temperatures of the thermal lamination process and is a material having a coefficient of linear expansion as specified later. When a heating temperature at the time of the thermal lamination is 250 degrees C., for example, heat resistant plastic films, such as non-thermoplastic polyimide films; and metallic foils, such as copper foils, aluminum foils, and SUS foils etc. may suitably be used. Especially, polyimide films are more preferably used for reasons of excellent physical properties etc.

The protective material is not especially limited as long as it has a shape of a sheet or a film, and preferably it has a certain level of thickness, in order to suppress formation of wrinkling formed in the laminate obtained after a thermal lamination process. For example, when using non-thermoplastic polyimide films marketed in general as a protective material, they preferably have a thickness of not less than 75 micrometers.

More detailed description will be given about cause of occurrence of visual defects such as wrinkling in a laminate obtained in a thermal lamination process. For example, in case of thermal lamination of a metallic foil and a thermoplastic polyimide film (heat resistant adhesive material) by a heated roll type thermal lamination device, the metallic foil and the thermoplastic polyimide film are laminated by being passed through between press rolls.

Here, in thermal lamination, both of the metallic foil and the thermoplastic polyimide film are in a condition of being expanded with heat. However, a thermoplastic polyimide has a larger coefficient of linear expansion than a coefficient of linear expansion of a metallic foil in general. Accordingly, the thermoplastic polyimide film is laminated on the metallic foil concerned in a condition of being extended more greatly in a planar direction than the metallic foil. And therefore, the thermoplastic polyimide film shrinks more greatly in the planar direction than the metallic foil when cooled (motion occurs in the planar direction), resulting in wrinkling caused in a width direction in the laminate obtained.

The present invention suppresses motions in a planar direction caused in a heat resistant adhesive material, such as thermoplastic polyimide film, in a cooling process using a protective material. Therefore, in case of a non-thermoplastic polyimide film, a thickness of less than 75 micrometers cannot exhibit sufficient strength, and thereby there is a possibility that occurrence of wrinkling may not be effectively avoided. Besides, an upper limit of the thickness is not especially limited and may appropriately be determined from a point of handling property and cost.

Moreover, the metallic foil should just have a thickness of grade for exhibiting suitable strength. Specific thickness is appropriately determined according to kinds of metal etc., and is not limited in particular.

The protective material cannot exhibit appropriate function as a protective material, unless it has a certain level of hardness (rigidity) when heated. Therefore, an elastic modulus in tension at the time of heating of a protective material is preferably not less than 490 N/mm² (50 kgf/mm²)

<Coefficient of Linear Expansion of Heat Resistant Adhesive Material and Protective Material>

A method for manufacturing a heat resistant flexible laminated layer by the present invention specifies coefficients of linear expansion of the heat resistant adhesive material and the protective material within a predetermined range on the basis of a coefficient of linear expansion of a metallic foil. In addition, the heat resistant adhesive material and the protective material are collectively referred to as materials to be laminated for convenience of description, if needed.

In particular, when a coefficient of linear expansion of the metallic foil is specifically set to $\alpha_0$, in the case where any compositions, structures and preparation methods are adopted as these materials to be laminated, coefficients of linear expansion in a temperature range of 200 degrees C. to 300 degrees C. of the heat resistant adhesive material and the protective material are within a range of $\alpha_0 \pm 10$ ppm/degree C., and preferably they are in a range of $\alpha_0 \pm 5$ ppm/degree C. In other words, when a coefficient of linear expansion of the heat resistant adhesive material is defined as alpha 1 and a coefficient of linear expansion of the protective material is defined as alpha 2 in a temperature range of 200 degrees C. to 300 degrees C., these coefficients of linear expansion $\alpha_1$ and $\alpha_2$ should just be within ranges shown in following equations (11) and (12), and preferably in ranges shown in following equations (13) and (14).

$$\alpha_0 - 10 \text{ ppm/degree C} <= \alpha_1 <= \alpha_0 + 10 \text{ ppm/degree C}. \quad (11)$$

$$\alpha_0 - 10 \text{ ppm/degree C} <= \alpha_2 <= \alpha_0 + 10 \text{ ppm/degree C}. \quad (12)$$

$$\alpha_0 - 5 \text{ ppm/degree C} <= \alpha_1 <= \alpha_0 + 5 \text{ ppm/degree C}. \quad (13)$$

$$\alpha_0 - 5 \text{ ppm/degree C} <= \alpha_2 <= \alpha_0 + 5 \text{ ppm/degree C}. \quad (14)$$

For example, in case of use of a copper foil having a coefficient of linear expansion of 19 ppm/degree C as a metallic foil, a coefficient of linear expansion $\alpha_1$ of a heat resistant adhesive material should just be within a range of 9 ppm/degree C. to 29 ppm/degree C., and preferably within a range of 14 ppm/degree C. to 24 ppm/degree C. And similarly, a coefficient of linear expansion $\alpha_2$ of the protective material should just also be within a range of 9 ppm/degree C. to 29 ppm/degree C., and preferably within a range of 14 ppm/degree C. to 24 ppm/degree C.

Not only occurrence of visual defects such as wrinkling in a heat resistant flexible laminate obtained may be avoided, but occurrence of dimensional changes at the time of etching may effectively be avoided by specifying coefficients of linear expansion of the materials to be laminated within the ranges.

When a difference between the coefficients of linear expansion of the heat resistant adhesive material and the protective material and the coefficient of the linear expansion of the metallic foil is out of the range, a residual stress will be induced in the materials to be laminated, and a percentage of dimensional change after etching will become larger. In detail, during the thermal lamination, heating and cooling are applied to materials to be laminated at a fixed period (referred to as heating-cooling cycle). This heating-cooling cycle causes difference of degree of thermal expansion and thermal contraction between the heat resistant adhesive material and the protective material, and the metallic foil, and as a result induces a residual stress in the heat resistant adhesive material and the protective material.

Wholehearted investigations performed by the present inventors revealed that a disposing of the protective material having a coefficient of linear expansion of not more than 100 ppm/degree C. in a temperature range of 200 degrees C. to 300 degrees C. between a metallic foil and a pressurized surface, improves occurrence of visual defects, when a technique of Referential Patent 3 mentioned above is used.

Furthermore, investigations wholeheartedly performed by the present inventors independently revealed that both of specification of a coefficient of linear expansion not only of the protective material but of the heat resistant adhesive material, and simultaneously specification of a ratio of a coefficient of linear expansion of these materials to be laminated with respect to a coefficient of the linear expansion of metallic foil were effective in order to also avoid dimensional change at the time of etching. Therefore, a heat resistant flexible laminate with high quality can be manufactured using the present invention.

Methods for measuring the coefficient of linear expansion is not especially limited, and any conventionally well-known methods may be used, as long as it is a method of measuring a reversible variation per unit length of a length of these materials for 1 degree C. of temperature changes in the metallic foil, the heat resistant adhesive material, or the protective material. Moreover, a measured coefficient of linear expansions may be used for evaluation as it is, or may be processed, if needed, such as calculating an average, to be used for evaluation. For example, in Examples mentioned later, coefficients of linear expansion are measured in a temperature range from 10 degrees C. to 330 degrees C. at a heating rate of 10 degrees C./minute, and subsequently, an average within a range of 200 degrees C. to 300 degrees C. is calculated for use of evaluation.

Control methods of a coefficient of linear expansion in the materials to be laminated are not especially limited. For example, methods, such as charge of fillers and adjustment of a thickness ratio of multi-layer construction, may be mentioned for the heat resistant adhesive materials. Moreover, appropriately commercially available thermally fusible sheets exhibiting coefficients of linear expansion within the range may be selected. Similarly, commercially available polyimide films exhibiting coefficients of linear expansion within the range should just be selected for the protective material.

<Percentage of Dimensional Change Before and after Etching>

In a heat resistant flexible laminate by the present invention, it is extremely preferable that a percentage of dimensional change before and after etching for removing at least a part of a metallic foil is in a range ±0.05%. A percentage of dimensional change as used herein is usually represented with a ratio of a difference between a predetermined dimension in a heat resistant flexible laminate before etching process and a predetermined dimension after etching process.

When a percentage of dimensional change becomes out of the range, a dimensional change after formation of minute wirings will become larger in the heat resistant flexible laminate, resulting in shift of disposed position of components in a designing phase. As a result, possibility may occur that components and substrate mounted thereto are not satisfactorily connected. In other word, it will be believed that a percentage of dimensional change within the range does not substantially cause dimensional change at the time of etching.

Methods for measuring the percentage of dimensional change are not especially limited, and any conventionally well-known methods may be used, as long as they are methods enabling determination of a change in dimension caused before and after etching process in a heat resistant flexible laminate.

Here, a percentage of dimensional change is necessarily measured in both of a traveling direction (MD) and of a width direction (TD, that is, a vertical direction to the MD) in a continuously performed thermal lamination process. Since environments are different in the direction of MD and in the direction of the TD in continuous lamination (for example, in applied tensions), a difference appears in a degree of thermal expansion and contraction, leading to different percentages of dimensional change. Therefore, for materials with a small percentage of dimensional change, it is required that small percentages of dimensional change in both of the MD direction and TD direction should be presented. Thus, measurement of percentages of dimensional change in both of MD and TD direction can evaluate dimensional stability of a heat resistant flexible laminate more clearly.

Besides, specific conditions of etching process in measuring a percentage of dimensional change are not especially limited. That is, since etching conditions differ depending on kinds of metallic foils, and configurations of pattern wirings to be formed, any conventionally well-known conditions may be used as conditions for etching process in measurement of a percentage of dimensional change in the present invention. In the present invention, a percentage of dimensional change should just be within a range of −0.05% to +0.05%, even if any kind of etching process is adopted in the heat resistant flexible laminate.

When a desired pattern wiring is formed by etching of a metallic foil as mentioned above in a heat resistant flexible laminate obtained by the method of the present invention, the heat resistant flexible laminate may be used as a flexible wiring plate having various kinds of miniaturized components with high-density mounted thereon. Naturally, applications of the present invention are not limited to the above-described application, and the laminated layers may be used in various applications if they include metallic foils.

EXAMPLE

Although descriptions in more detail of the present invention will, hereinafter, be given based on Examples and Comparative Examples, the present invention is not limited to them. Besides, a coefficient of linear expansion, a percentage of dimensional change, a peeling strength for removing a metallic foil, and a visual appearance of flexible laminates in Examples and Comparative Examples were measured and evaluated as follows.

[Coefficient of Linear Expansion]

A heat resistant adhesive material, a protective material, and a metallic foil were measured for a coefficient of linear expansion: using a thermal mechanical analysis device produced by Seiko Instruments Inc., trade name: TMA (Thermomechanical Analyzer) 120C, after measurement was performed under nitrogen atmosphere, at a temperature rising velocity of 10 degrees/minute in a temperature range 10 degrees C. to 330 degrees C., an average value within a range of 200 degrees C. to 300 degrees C. was calculated.

[Percentage of Dimensional Change]

In conformance with JIS C 6481, four holes were formed in a flexible laminate and each distance between each hole was measured. Next, after removal of a metallic foil from the flexible laminate by an etching process, the flexible laminate was kept standing in a thermostatic chamber of 20 degrees C., 60% RH for 24 hours. Then, each distance was measured for the four holes in a same manner as before the etching process. A measured value of a distance between each hole before removal of the metallic foil is defined as $D_1$, and a measured value of a distance between each hole after removal of the metallic foil is defined as $D_2$ to determine a percentage of dimensional change by a following equation.

Percentage of dimensional change (%)= $\{(D_2-D_1)/D_1\} \times 100$

In addition, the percentage of dimensional change was measured in both of traveling direction (MD) and width direction (TD: vertical direction to MD).

[Peeling Strength of Metallic Foil]

A sample was made in conformance with "6.5 Peel strength" of JIS C 6471, and a metallic foil part of 5 mm width was peeled on a condition of 180 degrees of peeling angle and a velocity of 50 mm/minute to measure a load.

[Evaluation of Visual Appearance]

A CCL was manufactured as a heat resistant flexible laminate by the present invention or a comparative flexible laminate for visual evaluation. Existence of wrinkling and wave etc. was observed. Existence of wrinkling and wave etc. gave evaluation of "Poor", and absence thereof means effective avoidance of visual defects to give "Good". In Examples 1 to 5 and Comparative Examples 1 to 4, polyamido acid or a precursor of thermoplastic polyimide used for a heat resistant adhesive material was synthesized according to either of following synthetic examples 1 to 3.

Synthetic Example 1

Into a glass flask with a capacity of 1,000 ml, N,N-dimethylformamide (DMF) 650 g, and 2,2'-bis[4-(4-amino phenoxy)phenyl]propane (BAPP) 0.20 mol were introduced, and then 3,3',4,4'-benzophenone tetracarboxylic acid dianhydride (BTDA) 0.07 mol was gradually added while agitating under nitrogen atmosphere. Subsequently, into the reaction solution in the flask, 3,3',4,4'-ethylene glycol dibenzoate tetracarboxylic acid dianhydride (TMEG) 0.12 mol was added, and agitated for 30 minutes in an iced bath. A TMEG solution obtained by dissolving TMEG 0.01 mol in DMF 35 g was prepared. After agitating for 30 minutes, while cautious observation of viscosity of the reaction solution in the flask, the TMEG solution was gradually added with agitation. When a viscosity of the reaction solution reached 3,000 poise, addition of TMEG and agitation were terminated to obtain a polyamido acid solution (1).

Synthetic Example 2

A polyamido acid solution (2) was prepared by a similar method as in the synthetic example 1, except for having used DMF 740 g in a glass flask with a capacity of 1,000 ml, for having gradually added 2,2'-bis(hydroxyphenyl)propane dibenzoate tetracarboxylic acid dianhydride (ESDA) 0.07 mol in place of BTDA, and for having dissolved TMEG 0.01 mol in DMF 30 g to prepare a TMEG solution.

Synthetic Example 3

A polyamido acid solution (3) was prepared by a similar method as in the synthetic example 1, except for having used DMF 600 g in a glass flask with a capacity of 1,000 ml, for having gradually added 3,3',4,4'-biphenyl tetracarboxylic acid dianhydride (BPDA) 0.18 mol in place of BTDA, and for having added TMEG 0.01 mol in place of TMEG 0.12 mol first, and for having dissolved TMEG 0.01 mol in DMF 20 g to prepare a TMEG solution.

Example 1

The polyamido acid solution (1) obtained in the synthetic example 1 was diluted with DMF until it was 10% of solid content concentration. Then, the polyamido acid solution was applied to both sides of a polyimide film (trade name APICAL 17 HP; manufactured by KANEKA CORPORATION). A coating thickness of the polyamido acid solution at this time was set so that a final thickness of one side of a thermoplastic polyimide layer to be obtained after imidization might be 4 micrometers. After heating of a layer coated under conditions at 120 degrees C. for 4 minutes, the layer was heated under conditions of at 380 degrees C. for 20 seconds, and then imidization was performed while removing an organic solvent from the applied layer of polyamido acid.

Thereby, a heat resistant adhesive material (1) having a three-layered structure of thermoplastic polyimide layer (adhesive layer)/polyimide film (core film or insulating film)/thermoplastic polyimide layer (adhesive layer) was obtained. A coefficient of linear expansion of this heat resistant adhesive material (1) in a temperature range of 200 degree C. to 300 degree C. gave 20 ppm/degree C.

Rolled copper foils (trade name BHY-22 B-T; Japan Energy Corporation, coefficient of linear expansion of 19 ppm/degree C.) having a thickness of 18 micrometers were disposed on both sides of the heat resistant adhesive material (1), and furthermore on the both sides thereof, non-thermoplastic polyimide films (trade name APICAL 125 NPI; manufactured by KANEKA CORPORATION, coefficient of linear expansion of 16 ppm/degree C.) were disposed as a protective material. Using a heated roll laminating machine, thermal lamination process was performed under conditions of a lamination temperature of 300 degrees C., a lamination pressure of 196 N/cm (20 kgf/cm), and a lamination velocity of 1.5 m/minute to manufacture a heat resistant flexible laminate (1) by the present invention.

Table 1 shows obtained evaluation results or measurements of a percentage of dimensional change, a peeling strength of a metallic foil, and visual appearance of the heat resistant flexible laminate (1).

Example 2

A similar operation as in Example 1 was repeated using the polyamido acid solution (2) obtained in the synthetic example 2, and a heat resistant adhesive material (2) having a three-layered structure was obtained. A coefficient of linear expansion in a temperature range of 200 degrees C. to 300 degrees C. of this heat resistant adhesive material (2) gave 21 ppm/degree C. To both sides of this heat resistant adhesive material (2), a rolled copper foil and a protective material (non-thermoplastic polyimide film) of same kinds as in Example 1 were disposed, respectively, and a thermal lamination process was performed under same conditions as in Example 1 to manufacture a heat resistant flexible laminate (2) by the present invention. Table 1 shows obtained evaluation results or measurements of a percentage of dimensional change, a peeling strength of a metallic foil, and visual appearance of the heat resistant flexible laminate (2).

Example 3

Using the polyamido acid solution (3) obtained in the synthetic example 3, a similar operation as in Example 1 was performed to obtain a heat resistant adhesive material (3) having a three-layered structure. A coefficient of linear expansion in a temperature range of 200 degrees C. to 300 degrees C. of this heat resistant adhesive material (3) gave 20 ppm/degree C. To both sides of this heat resistant adhesive material (2), a rolled copper foil and a protective material (non-thermoplastic polyimide film) of same kind as in Example 1 were disposed, respectively, and a thermal lamination process was performed under same conditions as in Example 1 to manufacture a heat resistant flexible laminate (3) by the present invention, except having set a lamination temperature to 380 degrees C. Table 1 shows obtained evaluation results or measurements of a percentage of dimensional change, a peeling strength of a metallic foil, and visual appearance of the heat resistant flexible laminate (3).

Example 4

To both sides of a heat resistant adhesive material (1) obtained in Example 1, an electrolytic copper foil (trade name 3EC-VLP; manufactured by Mitsui Mining and Smelting Co., Ltd., a coefficient of linear expansion of 18 ppm/degree C.) having a thickness of 12 micrometers was disposed, furthermore on both sides thereof, non-thermoplastic polyimide films (trade name APICAL 75 NPI; manufactured by KANEKA CORPORATION, a coefficient of linear expansion of 16 ppm/degree C.) were disposed as a protective material, and then a thermal lamination process was performed under identical conditions as in Example 1 to manufacture a heat resistant flexible laminate (4) by the present invention. Table 1 shows obtained evaluation results or measurements of a percentage of dimensional change, a peeling strength of a metallic foil, and visual appearance of the heat resistant flexible laminate (4).

Example 5

The polyamido acid solution (3) obtained in the synthetic example 3 was diluted with DMF until it was 10% of solid content concentration. Then, the polyamido acid solution was applied to both sides of a polyimide film (trade name APICAL 7.5 HP; manufactured by KANEKA CORPORATION). A coating thickness of the polyamido acid solution at this time was set so that a final thickness of one side of a thermoplastic polyimide layer to be obtained after imidization might be 2.5 micrometers. After heating of a layer coated under conditions at 120 degrees C. for 4 minutes, the layer was heated under conditions of at 380 degrees C. for 20 seconds, and then imidization was performed while removing an organic solvent from the applied layer of polyamido acid.

Thereby, a heat resistant adhesive material (4) having a three-layered structure of thermoplastic polyimide layer (adhesive layer)/polyimide film (core film or insulating film)/thermoplastic polyimide layer (adhesive layer) was obtained. A coefficient of linear expansion of this heat resistant adhesive material (4) in a temperature range of 200 degree C. to 300 degree C. gave 27 ppm/degree C.

To both sides of this heat resistant adhesive material (2), an electrolytic copper foil and a protective material (non-thermoplastic polyimide film) of same kinds as in Example 4 were disposed, respectively, a thermal lamination process was performed under same conditions as in Example 1 except having set a lamination temperature to 380 degrees C., and a heat resistant flexible laminate (5) by the present invention was manufactured. Table 1 shows obtained evaluation results or measurements of a percentage of dimensional change, a peeling strength of a metallic foil, and visual appearance of the heat resistant flexible laminate (5).

Comparative Example 1

To both sides of the heat resistant adhesive material (1) obtained in Example 1, rolled copper foils of a same kind as in Example 1 were disposed, furthermore, to both sides thereof a non-thermoplastic polyimide films (trade name APICAL 125AH; manufactured by KANEKA CORPORATION, a coefficient of linear expansion of 40 ppm/degree C.) were disposed as a protective material, and a thermal lamination process was performed under identical conditions as in Example 1 to manufacture a heat resistance flexible laminate for comparison (1). That is, a difference of a coefficient of linear expansion between the rolled copper foil (a coefficient of linear expansion of 19 ppm/degree C.) and the protective material was set as 21 ppm/degree C. Table 1 shows obtained evaluation results or measurements of a percentage of dimensional change, a peeling strength of a metallic foil, and visual appearance of the heat resistant flexible laminate for comparison (1).

Comparative Example 2

Except for having set a coating thickness of a polyamido acid solution so that a final thickness on one side of a thermoplastic polyimide layer obtained after imidization might be 8 micrometers, a similar operation as in Example 1 was performed to obtain a heat resistant adhesive material (5) having a three-layered structure. A coefficient of linear expansion of this heat resistant adhesive material (5) in a temperature range of 200 degree C. to 300 degree C. gave 32 ppm/degree C. To both sides of this heat resistant adhesive material (5), a rolled copper foil and a protective material (non-thermoplastic polyimide film) of same kind as in Example 1 were disposed, respectively, and then a thermal lamination process was performed under identical conditions as in Example 1 to manufacture a heat resistance flexible laminate for comparison (2). That is, a difference of a coefficient of linear expansion between the rolled copper foil (a coefficient of linear expansion of 19 ppm/degree C.) and the heat resistant protective material was set as 13 ppm/degree C. Table 1 shows obtained evaluation results or measurements of a percentage of dimensional change, a peeling strength of a metallic foil, and visual appearance of the heat resistant flexible laminate for comparison (2).

Comparative Example 3

To both sides of a heat resistant adhesive material (5), a rolled copper foil and a protective material (non-thermoplastic polyimide film) of same kind as in Example 1 were disposed, respectively, and then a thermal lamination process was performed under same conditions as in Example 1 except having set a lamination pressure as 20 N/cm (2 kgf/cm) to manufacture a heat resistance flexible laminate for comparison (3). That is, the lamination pressure was set lower in order to improve dimensional stability in Comparative Example 2. Table 1 shows obtained evaluation results or measurements of a percentage of dimensional change, a peeling strength of a metallic foil, and visual appearance of the heat resistant flexible laminate for comparison (3).

Comparative Example 4

To both sides of a heat resistant adhesive material (1) obtained in Example 1, a rolled copper foil of a same kind as in Example 1 were disposed, and then a thermal lamination process was performed under identical conditions as in Example 1 to manufacture a heat resistance flexible laminate for comparison (4). That is, a thermal lamination process was performed without using a protective material. Table 1 shows obtained evaluation results or measurements of a percentage of dimensional change, a peeling strength of a metallic foil, and visual appearance of the heat resistant flexible laminate for comparison (4).

TABLE 1

|  | Dimensional Stability(%) | | Visual | Adhesive Strength |
| --- | --- | --- | --- | --- |
|  | MD | TD | Appearance | [N/cm(kgf/cm)] |
| Example 1 | −0.03 | 0.02 | Good | 9.8 (1.0) |
| Example 2 | −0.02 | 0.02 | Good | 9.8 (1.0) |
| Example 3 | −0.02 | 0.01 | Good | 10.78 (1.1) |
| Example 4 | −0.03 | 0.03 | Good | 11.76 (1.2) |
| Example 5 | −0.05 | 0.05 | Good | 7.84 (0.8) |
| Comparative Example 1 | −0.15 | 0.10 | Good | 9.8 (1.0) |
| Comparative Example 2 | −0.30 | 0.30 | Good | 7.84 (0.8) |
| Comparative Example 3 | −0.03 | 0.02 | Good | 2.94 (0.3) |
| Comparative Example 4 | −0.50 | 0.45 | Poor | 7.84 (0.8) |

As Table 1 shows, a heat resistant flexible laminate by the present invention shows excellent visual appearance after thermal lamination process and dimensional stability after etching process as well as high adhesive strength.

On the other hand, as Comparative Example 1 or Comparative Example 2 show, when a coefficient of linear expansion of adhesive materials or protective materials has a larger difference between a coefficient of a linear expansion of a metallic foil, dimensional stability after etching process falls. As Comparative Example 3 shows, although it is possible to improve this dimensional stability using a low lamination pressure at the time of thermal lamination process, a problem occurs that adhesive strength with the metallic foil will fall. Moreover, Comparative Example 4 without use of a protective material gave both a poor dimensional stability, and visual appearance.

In addition, specific Examples or embodiments performed in a section of BEST MODE FOR CARRYING-OUT OF THE INVENTION persistently clarifies technical contents of the present invention, the present invention should not be understood only with limitation of such examples in a narrow sense, and the present invention can be carried out with various modifications within a range of spirit of the present invention, and claims described hereinafter.

INDUSTRIAL APPLICABILITY

As described above, use of a method for manufacturing a heat resistant flexible laminate by the present invention can increase adhesive strength of a metallic foil in the heat resistant flexible laminate obtained, it gives excellent visual appearance, and dimensional stability before and after etching. Since a heat resistant flexible laminate by the present invention has excellent dimensional stability, it can be especially suitably used as a wiring plate of miniaturized electronic devices with high-density etc. Therefore, the present invention may be used in not only a field of raw material processing industry for manufacturing laminates, but may be suitably used in industrial fields for manufacturing various kinds of electric and electronic devices, and components thereof.

The invention claimed is:

1. A method for manufacturing a heat resistant flexible laminate comprising a step of laminating
a metallic foil having a coefficients of linear expansion defined as ●$_0$ ppm/degree C. in a temperature range of 200 degrees C. to 300 degrees C. and a heat resistant adhesive material having a coefficient of linear expansion within a range of ●$_0$±10
by thermal lamination in a temperature range of not less than 200 degrees C.,
wherein a film-like protective material having a coefficient of linear expansion within a range of ●$_0$±10 is disposed on the outside of the metallic foil between a pressurized surface and the metallic foil at the time of the thermal lamination, and
wherein the metallic foil is a rolled copper foil or an electrolytic copper foil.

2. The method for manufacturing a heat resistant flexible laminate according to claim 1,
wherein the film-like protective material is a heat resistant plastic film.

3. The method for manufacturing a heat resistant flexible laminate comprising a step of laminating
a metallic foil having a coefficient of linear expansion defines as ●$_0$±10 ppm/degree C. in a temperature range of 200 degrees C. to 300 degrees C. and a heat resistant adhesive material having a coefficient of linear expansion within a range of ●$_0$±10
by thermal lamination in a temperature range of not less than 200 degrees C.,
wherein a reusable film-like protective material having a coefficient of linear expansion within a range of ●$_0$±10 is detachably secured to the outside of the metallic foil between a pressurized surface and the metallic foil at the time of thermal lamination, such that the protective material can be removed after lamination and re-used, and
wherein the metallic foil is a rolled copper foil or an electrolytic copper foil.

* * * * *